US012771326B2

(12) United States Patent
In et al.

(10) Patent No.: US 12,771,326 B2
(45) Date of Patent: Oct. 20, 2026

(54) ELECTRONIC DEVICE FOR IMPEDANCE MATCHING AND OPERATING METHOD THEREOF

(71) Applicant: SAMSUNG ELECTRONICS CO., LTD., Suwon-si (KR)

(72) Inventors: Solhee In, Suwon-si (KR); Jaesup Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 182 days.

(21) Appl. No.: 18/765,500

(22) Filed: Jul. 8, 2024

(65) Prior Publication Data

US 2025/0055444 A1 Feb. 13, 2025

(30) Foreign Application Priority Data

Aug. 8, 2023 (KR) ........................ 10-2023-0103699

(51) Int. Cl.
*H03H 11/28* (2006.01)
*H02J 50/12* (2016.01)
*H02M 7/217* (2006.01)
*H03H 7/38* (2006.01)

(52) U.S. Cl.
CPC ............. *H03H 11/28* (2013.01); *H02J 50/12* (2016.02); *H02M 7/217* (2013.01); *H03H 7/38* (2013.01)

(58) Field of Classification Search
CPC ......... H03H 11/28; H03H 7/38; H02M 7/217; H02J 50/12
See application file for complete search history.

(56) References Cited

U.S. PATENT DOCUMENTS 7,917,104 B2 3/2011 Manssen et al.
8,288,893 B2 10/2012 Cook et al.
8,952,792 B1 * 2/2015 Srinivas ................ H01Q 1/248 363/139
RE47,755 E * 12/2019 Hyde ................ G06K 19/0726
(Continued)

FOREIGN PATENT DOCUMENTS

KR 10-2010-0038286 A 4/2010
KR 10-1288706 B1 7/2013
(Continued)

*Primary Examiner* — Gary L Laxton
*Assistant Examiner* — Jennifer C Caulk
(74) *Attorney, Agent, or Firm* — Morgan, Lewis & Bockius LLP

(57) ABSTRACT

Provided is an electronic device including a matching circuit having different matching impedance values according to connection states of the plurality of switches, and configured to output a matching power signal by impedance matching an input power signal, a power conversion circuit configured to convert the matching power signal into an output power signal, and a controller configured to set the matching impedance value of the matching circuit by transmitting a switching signal for adjusting the connection states of the plurality of switches to the plurality of switches, wherein the controller is further configured to receive the output power signal from the power conversion circuit while changing the matching impedance value, select an optimal matching impedance value based on a plurality of output power signals that are received, and set the optimal matching impedance value as the matching impedance value.

14 Claims, 14 Drawing Sheets

(56) References Cited

U.S. PATENT DOCUMENTS

| | | | | |
|---|---|---|---|---|
| 10,554,147 | B2 | 2/2020 | Rangel et al. | |
| 2010/0277003 | A1* | 11/2010 | Von Novak | H02J 50/40 323/283 |
| 2013/0257677 | A1 | 10/2013 | Jeong | |
| 2020/0403451 | A1 | 12/2020 | Davlantes | |
| 2021/0339008 | A1 | 11/2021 | Smith et al. | |
| 2021/0391754 | A1* | 12/2021 | Smith | H02J 50/10 |
| 2022/0006333 | A1 | 1/2022 | Yeo et al. | |

FOREIGN PATENT DOCUMENTS

| | | | |
|---|---|---|---|
| KR | 10-2013-0109408 | A | 10/2013 |
| KR | 10-1445082 | B1 | 10/2014 |
| KR | 10-2014-0129915 | A | 11/2014 |
| KR | 10-2018-0081712 | A | 7/2018 |
| KR | 10-2020-0114847 | A | 10/2020 |
| KR | 10-2022-0092725 | A | 7/2022 |

* cited by examiner

FIG. 7

| IMPEDANCE [Ω] | S1 | S2 | S3 | S4 | S5 | S6 |
|---|---|---|---|---|---|---|
| 0 | OFF | OFF | OFF | OFF | OFF | OFF |
| 1 | ON | OFF | OFF | OFF | OFF | OFF |
| 1.5 | ON | OFF | OFF | ON | ON | OFF |
| 2 | ON | ON | OFF | OFF | OFF | OFF |
| 2.5 | ON | ON | OFF | ON | ON | OFF |
| 3 | ON | ON | ON | OFF | OFF | OFF |
| 3.5 | ON | ON | ON | ON | ON | OFF |
| 4 | ON | ON | ON | ON | OFF | ON |

ELECTRONIC DEVICE FOR IMPEDANCE MATCHING AND OPERATING METHOD THEREOF

CROSS-REFERENCE TO RELATED APPLICATION

This application is based on and claims priority under 35 U.S.C. § 119 to Korean Patent Application No. 10-2023-0103699, filed on Aug. 8, 2023, in the Korean Intellectual Property Office, the disclosure of which is incorporated by reference herein in its entirety.

BACKGROUND

The inventive concept relates to an electronic device for impedance matching.

Wireless power transmission is a technology for transmitting power without a physical electrical connection from the power supply to electronic device, which may be used for charging electronic devices, such as smartphones.

Using wireless power transmission to provide power to devices without a physical electrical connection can involve power consumption resulting from changes to the transmitting and receiving sides of the devices, the transmission distance, and other factors. It is desirable to provide maximum power with minimal losses to the load to achieve high efficiency. Impedance changes and impedance matching can play a role in achieving this high efficiency for radio frequency (RF) transmission in various frequency bands.

In this regard, the amount of power received by electronic devices may change by a relatively large amount for various reasons. Accordingly, in order for electronic devices to process power with high efficiency, a method of performing impedance matching more accurately is of interest.

SUMMARY

The inventive concept provides an electronic device capable of receiving power with high efficiency.

According to an aspect of the inventive concept, there is provided an electronic device including a matching circuit including a plurality of capacitors and a plurality of switches, having different matching impedance values according to connection states of the plurality of switches, and configured to output a matching power signal by impedance matching an input power signal, a power conversion circuit configured to convert the matching power signal in an alternating current (AC) form into an output power signal in a direct current (DC) form, and a controller configured to set the matching impedance value of the matching circuit by transmitting a switching signal to the plurality of switches, wherein the switching signal sets the connection state of the plurality of switches, and wherein the controller is further configured to select an optimal matching impedance value based on a plurality of output power signals that are received from the power conversion circuit, and set the optimal matching impedance value as the matching impedance value.

According to another aspect of the inventive concept, there is provided an electronic device including a matching circuit including a plurality of capacitors and a plurality of switches, having different matching impedance values according to connection states of the plurality of switches, and configured to output a matching power signal by impedance matching an input power signal, a power conversion circuit configured to convert the matching power signal in an AC form into an output power signal in a DC form, and a controller configured to set the matching impedance value of the matching circuit by transmitting a switching signal for adjusting the connection states of the plurality of switches to the plurality of switches, wherein the controller is further configured to set the matching impedance value to a first impedance value, and receive a first output power signal from the power conversion circuit, set the matching impedance value to a second impedance value that is greater than the first impedance value by a first adjustment value, and receive a second output power signal from the power conversion circuit, and select an optimal matching impedance value based on a result of comparing a voltage value of the first output power signal with a voltage value of the second output power signal, and set the optimal matching impedance value as the matching impedance value.

According to another aspect of the inventive concept, there is provided an operating method of an electronic device including a matching circuit, a power conversion circuit, and a controller, the matching circuit including a plurality of capacitors and a plurality of switches, having different matching impedance values according to connection states of the plurality of switches, and configured to output a matching power signal by impedance matching an input power signal, the power conversion circuit being configured to convert the matching power signal in an AC form into an output power signal in a DC form, and the controller being configured to set the matching impedance value of the matching circuit by transmitting a switching signal that alters the connection states of the plurality of switches to the plurality of switches, the operating method including receiving the output power signal from the power conversion circuit, selecting an optimal matching impedance value based on a plurality of output power signals that are received, and setting the optimal matching impedance value as the matching impedance value.

BRIEF DESCRIPTION OF THE DRAWINGS

Embodiments will be more clearly understood from the following detailed description taken in conjunction with the accompanying drawings in which:

FIG. 7 is a table illustrating a relationship between a matching impedance value of a matching circuit of an electronic device and a connection state of a switch, according to an embodiment;

DETAILED DESCRIPTION OF THE EMBODIMENTS

Principles and embodiments of the present invention relate generally to a wireless power transmission devices providing impedance matching for improved efficiency.

Hereinafter, embodiments will be described in detail with reference to the accompanying drawings.

Figure 1:
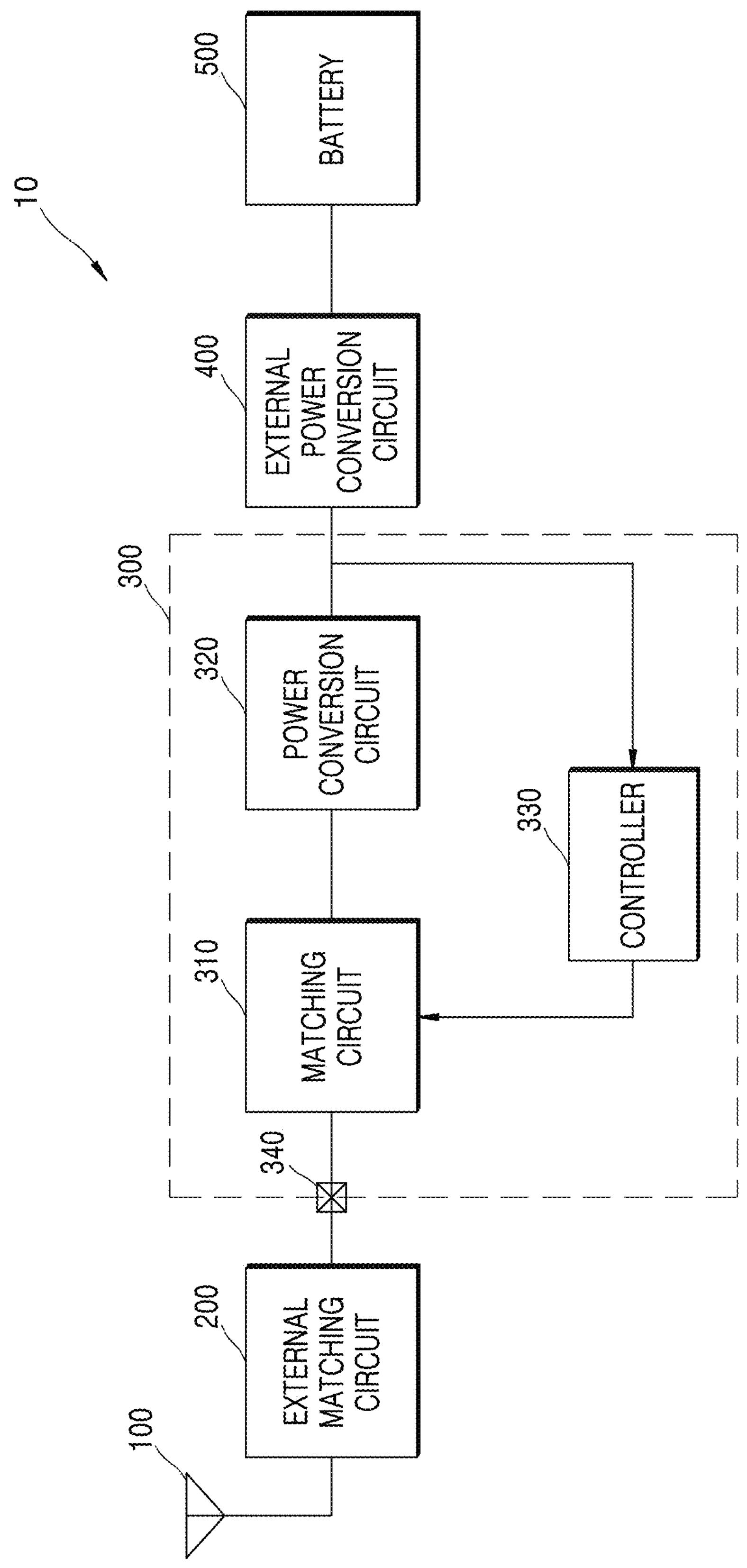
FIG. 1 is a block diagram illustrating an electronic device, according to an embodiment.

FIG. 1 is a block diagram illustrating an electronic device 10 according to an embodiment.

Referring to FIG. 1, the electronic device 10 according to an embodiment may include an antenna 100, an external matching circuit 200, an energy harvesting circuit 300, an external power conversion circuit 400, and a battery 500.

In various embodiments, the antenna 100 may receive power from an external wireless power transmission device. The antenna 100 may output a power signal in an alternating current (AC) form by using a radio frequency (RF) wave formed around the antenna 100. The antenna 100 may be connected to the external matching circuit 200. The antenna 100 may produce a power signal in an AC form in response to a signal that has been received wirelessly. The power signal in the AC form may be output from the antenna to an input terminal of the external matching circuit 200.

In various embodiments, the external matching circuit 200 may include at least one capacitor or at least one inductor. The external matching circuit 200 may perform impedance matching between the electronic device 10 and the external wireless power transmission device.

Figure 2:
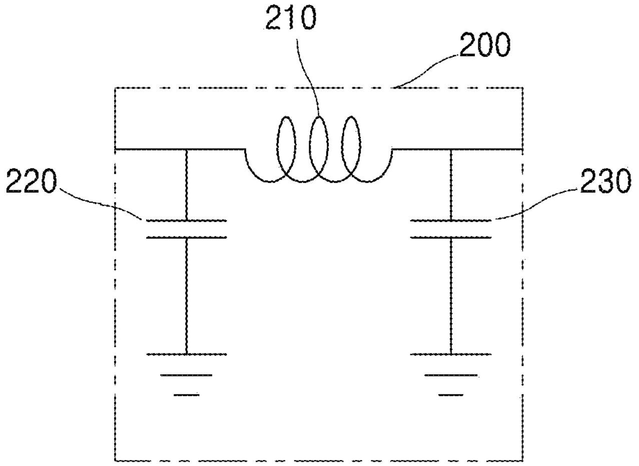
FIG. 2 is a circuit diagram illustrating an example of an external matching circuit of an electronic device, according to an embodiment.

In various embodiments, the external matching circuit 200 may be configured to match an impedance (or load) wirelessly connected to the antenna 100. The external matching circuit 200 may be a fixed impedance matching circuit that is operably connected to the antenna 100, where for example, the external matching circuit 200 may be configured to match an impedance (e.g., 50Ω) of the external wireless power transmission device in communication with the antenna 100. An example of the circuit configuration of the external matching circuit 200 may be as illustrated in FIG. 2, where the example is described in more detail below with reference to FIG. 2.

In various embodiments, the external matching circuit 200 may output an input power signal to the energy harvesting circuit 300 by impedance matching the power signal received from the antenna 100 to the energy harvesting circuit 300. The external matching circuit 200 may maximize the power transferred from the antenna 100 to the energy harvesting circuit 300, where an output power signal has a maximum voltage value among a plurality of output power signals.

In various embodiments, the energy harvesting circuit 300 may include a matching circuit 310, a power conversion circuit 320, and a controller 330. The controller may be electrically connected to the matching circuit 310. The energy harvesting circuit 300 may be connected to the external matching circuit 200 through a pad 340. The energy harvesting circuit 300 may be included in the electronic device 10 in an integrated chip (IC) form.

In various embodiments, the matching circuit 310 may output a matching power signal by impedance matching the input power signal from the external matching circuit 200, where the matching circuit 310 may perform additional impedance matching on the input power signal that has been primarily impedance matched by the external matching circuit 200. As a result, an output power signal that is as close as possible to the power signal received by the electronic device 10 through the antenna 100 may be output through the power conversion circuit 320.

In various embodiments, the matching circuit 310 may include a plurality of capacitors and a plurality of switches. An impedance value of the matching circuit 310 may be determined by a connection structure of the plurality of capacitors, and the impedance value of the matching circuit 310 may be referred to as a matching impedance value.

In various embodiments, the matching circuit 310 may have different matching impedance values according to connection states of the plurality of switches. The plurality of capacitors may have different connection structures according to the connection states of the plurality of switches, and thus, the matching circuit 310 may have different matching impedance values. The matching impedance values may be determined by the arrangement of connects for the plurality of capacitors, where the capacitors may be in parallel.

In various embodiments, the connection states of the plurality of switches may be controlled by a switching signal received from the controller 330, where the matching impedance value of the matching circuit 310 may be controlled by the switching signal received from the controller 330. The switching signal received from the controller 330 may change the state of one or more of the plurality of switches between an "on" state and an "off" state, where a capacitor may be electrically connected to the matching circuit 310 in response to the associated switch being in an "on" state.

Figure 3:
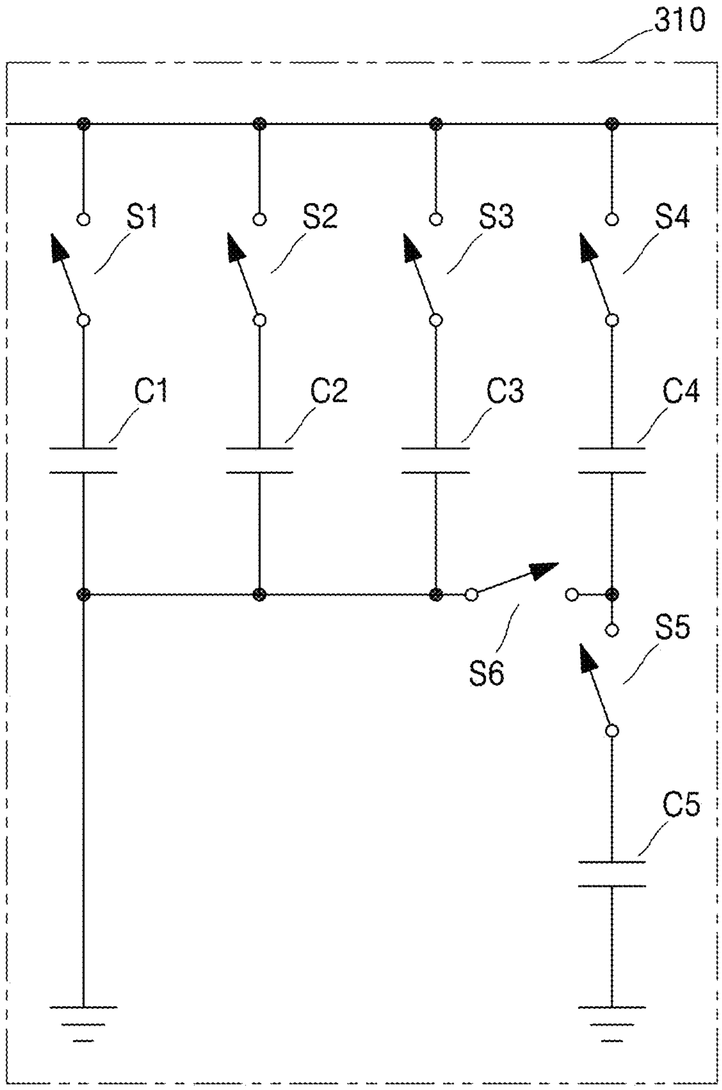
FIG. 3 is a circuit diagram illustrating an example of a matching circuit of an electronic device, according to an embodiment.

An example of the circuit configuration of the matching circuit 310 may be as illustrated in FIG. 3, and the example is described in more detail below with reference to FIG. 3.

In various embodiments, the power conversion circuit 320 may convert the matching power signal in the AC form into an output power signal in a direct current (DC) form. In an embodiment, the power conversion circuit 320 may include an RF-DC converter that converts the matching power signal in the AC form into the output power signal in the DC form.

In various embodiments, the controller 330 may control all operations of the electronic device 10. The controller 330 may transmit a switching signal for adjusting the connection states of the plurality of switches included in the matching circuit 310. The controller 330 may set the matching impedance value of the matching circuit 310 by transmitting the switching signal. The controller 330 sets the matching impedance value of the matching circuit 310, where the controller 330 adjusts the connection states of the plurality of switches through a switching signal, such that the matching circuit 310 has a specific matching impedance value.

In various embodiments, the controller 330 may receive an output power signal from the power conversion circuit 320 while changing the matching impedance value of the matching circuit 310.

In various embodiments, the controller 330 may set the matching impedance value of the matching circuit 310 through a switching signal, and may receive an output power signal corresponding to the set matching impedance value. In response, the controller 330 may change the matching impedance value of the matching circuit 310 by transmitting another switching signal to the matching circuit 310 and may receive an output power signal corresponding to the changed matching impedance value. The controller 330 may repeatedly change the matching impedance value of the matching circuit 310 through a switching signal and receive an output power signal corresponding to the changed matching impedance value in an iterative manner through feedback.

In an embodiment, the controller 330 may receive an output power signal from the power conversion circuit 320 while increasing the matching impedance value by a first adjustment value. For example, in a first operation, the controller 330 may set the matching impedance value to 0Ω and may receive an output power signal from the power conversion circuit 320. Hereinafter, Ω represents Ohms, and an impedance value to N Ω (N is a real number) may mean that the impedance value has a value corresponding to N Ω. In a second operation, when the first adjustment value is 1Ω, the controller 330 may set the matching impedance value to 1Ω, which is 0Ω increased by 1Ω, and may receive an output power signal from the power conversion circuit 320. In a third operation, the controller 330 may set the matching impedance value to 2Ω, which is 1Ω increased by 1Ω, and may receive an output power signal from the power conversion circuit 320. In the subsequent operation, the controller 330 may set the matching impedance value to 3Ω, 4Ω, etc., and may receive a corresponding output power signal from the power conversion circuit 320.

In various embodiments, when a voltage value of the received output power signal is less than a voltage value of a previously received output power signal, the controller 330 may stop receiving the output power signal from the power conversion circuit 320, while increasing the matching impedance value by the first adjustment value. In other words, when the voltage value of the output power signal received in the current operation is less than the voltage value of the output power signal received in the previous operation, the controller 330 may stop receiving the output power signal. When the voltage value of the received output power signal does not increase, the controller 330 may stop receiving the output power signal. This is because even when the controller 330 receives an output power signal while additionally increasing the matching impedance value, it is not possible to find a matching impedance value with higher power efficiency.

For example, in a case where a voltage value of an output power signal when the matching impedance value is 3Ω is less than a voltage value of an output power signal when the matching impedance value is 2Ω, the controller 330 may set the matching impedance value to 4Ω and may not receive an output power signal from the power conversion circuit 320.

Herein, a condition such as "value A is less than value B" may be replaced with a condition such as "value A is less than or equal to value B." Also, a condition such as "value A is greater than or equal to value B" may be replaced with a condition such as "value A is greater than value B."

In various embodiments, the controller 330 may select an optimal matching impedance value based on a plurality of output power signals that are received.

In an embodiment, the controller 330 may select, as the optimal matching impedance value, a matching impedance value corresponding to an output power signal having a maximum voltage value among the plurality of output power signals. For example, in a case where a voltage value of an output power signal when the matching impedance value is 2Ω is greater than voltage values of output power signals when the matching impedance value has other values, the controller 330 may select 2Ω as the optimal matching impedance value. In this case, because the controller 330 stops receiving the output power signal when the voltage value of the received output power signal does not increase, the controller 330 may set, as the optimal matching impedance value, a matching impedance value corresponding to an output power signal received second to last.

The controller 330 may set the optimal matching impedance value as the matching impedance value. For example, when the optimal matching impedance value is 2Ω, the controller 330 may set the matching impedance value to 2Ω through a switching signal. The electronic device 10 according to an embodiment may set the matching circuit 310 to have a matching impedance value corresponding to the output power signal having the maximum voltage value, thereby receiving power with high efficiency from the external wireless power transmission device.

In an embodiment, when the voltage value of the received output power signal is less than the voltage value of the previously received output power signal, the controller 330 may stop receiving the output power signal and may receive an additional output power signal. The controller 330 may set, as the matching impedance value, an impedance value that is greater than the matching impedance value corresponding to the output power signal having the maximum voltage value among the plurality of output power signals by a second adjustment value and may receive an additional output power signal from power conversion circuit 320. In this case, the second adjustment value may be less than the first adjustment value, and the additional output power signal may be referred to as an output power signal.

For example, in a case where the first adjustment value is 1 C and the second adjustment value is 0.5 C, when the controller 330 receives an output power signal only until the matching impedance value is 3 C, before stopping receiving the output power signal, the controller 330 may set the matching impedance value to 2.5 C and may receive an additional output power signal. In this case, because the controller 330 stops receiving the output power signal when the voltage value of the received output power signal does not increase, the controller 330 may set the matching impedance value to 2.5 C, which is greater than 2 C, that is, the matching impedance value corresponding to the output power signal received second to last, by 0.5 C, and may receive the additional output power signal.

In various embodiments, the controller 330 may select, as the optimal matching impedance value, a matching impedance value corresponding to a greater value of the maximum voltage value of the plurality of output power signals and a voltage value of the additional output power signal. For example, the controller 330 may select, as the optimal matching impedance value, a matching impedance value having a greater value among 2.5Ω, which is the matching impedance value corresponding to the voltage value of the additional output power signal, and 2Ω, which is the matching impedance value corresponding to the maximum voltage value of the plurality of output power signals.

As such, the electronic device 10 according to an embodiment may select the optimal matching impedance value based on an additional output power signal received based on a matching impedance value adjusted by using the second adjustment value that is less than the first adjustment value, thereby finely adjusting the matching impedance value of the matching circuit 310. The second adjustment value may be a value between two successive first adjustment values.

In various embodiments, the external power conversion circuit 400 may convert an output power signal in the DC form into a power signal in the DC form with a desired voltage value, where the voltage value can be within a predetermined range. In an embodiment, the external power conversion circuit 400 may include a DC-DC converter that converts an output power signal to have a voltage that is compatible with the battery 500.

In various embodiments, the battery 500 may be operably connected to the energy harvesting circuit 300. The battery 500 may store energy by using a power signal output from the external power conversion circuit 400, where the battery 500 may be electrically connected to the energy harvesting circuit 300. Although FIG. 1 illustrates the battery 500 as a component connected to the external power conversion circuit 400, a driving unit for driving a load or various operations of the electronic device 10 may be included instead of the battery 500.

FIG. 2 is a circuit diagram illustrating an example of the external matching circuit 200 of the electronic device 10 according to an embodiment.

Referring to FIG. 2, the external matching circuit 200 of the electronic device 10 may include an inductor 210, a first capacitor 220, and a second capacitor 230.

In various embodiments, the inductor 210 may be connected between the input terminal of the external matching circuit 200 and an output terminal of the external matching circuit 200. The first capacitor 220 may be connected between the input terminal of the external matching circuit 200 and a ground terminal of the external matching circuit 200, where the first capacitor 220 may be electrically connected between the input terminal and the inductor 210. The second capacitor 230 may be connected between the output terminal of the external matching circuit 200 and the ground terminal of the external matching circuit 200, where the second capacitor 230 may be electrically connected between the inductor 210 and the output terminal.

In various embodiments, the inductor 210, the first capacitor 220, and the second capacitor 230 may provide an impedance that matches an impedance of the external wireless power transmission device. For example, when the impedance of the external wireless power transmission device is 50Ω, a total impedance of the inductor 210, the first capacitor 220, and the second capacitor 230 may be 50Ω.

Although FIG. 2 illustrates an embodiment in which the external matching circuit 200 has a pi circuit form including the inductor 210, the first capacitor 220, and the second capacitor 230, the inventive concept is not limited thereto. Unlike the illustration of FIG. 2, the external matching circuit 200 may be configured to have various forms including a combination of an inductor and a capacitor, such as an L-type circuit, a reverse L-type circuit, or the like.

FIG. 3 is a circuit diagram illustrating an example of the matching circuit 310 of the electronic device 10 according to an embodiment.

Referring to FIG. 3, the matching circuit 310 of the electronic device 10 may include a plurality of capacitors C1 to C5 and a plurality of switches S1 to S6.

The plurality of capacitors C1 to C5 may provide a matching impedance value to the matching circuit 310. The plurality of capacitors C1 to C5 may be electrically connected to each other according to connection states of the plurality of switches S1 to S6, where a connection structure of the plurality of capacitors C1 to C5 may be adjusted, so that the matching impedance value of the matching circuit 310 may be adjusted.

In various embodiments, the plurality of capacitors C1 to C5 may include a plurality of parallel capacitors, that is, first to fourth parallel capacitors C1 to C4, and a series capacitor C5.

In various embodiments, the first to fourth parallel capacitors C1 to C4 may be connected to each other in parallel between a ground terminal and an input terminal to which an input power signal is applied. Although FIG. 3 illustrates an embodiment in which the matching circuit 310 includes four parallel capacitors, the first to fourth parallel capacitors C1 to C4, the inventive concept is not limited thereto, and the matching circuit 310 may include two, three, five, or more parallel capacitors. However, an embodiment including four parallel capacitors is mainly described for convenience.

In an embodiment, the first to fourth parallel capacitors C1 to C4 may have the same capacitance value (e.g., farads). As such, when the first to fourth parallel capacitors C1 to C4 have the same capacitor value, the controller 330 may linearly increase the matching impedance value by increasing the number of parallel capacitors connected to each other among the first to fourth parallel capacitors C1 to C4. For example, the controller 330 may increase the matching impedance value by the first adjustment value by increasing the number of parallel capacitors connected to each other among the first to fourth parallel capacitors C1 to C4.

In various embodiments, the series capacitor C5 may be connected in series between any one of the first to fourth parallel capacitors C1 to C4 and the ground terminal. Although FIG. 3 illustrates an embodiment in which the series capacitor C5 is positioned between the fourth parallel capacitor C4 and a ground terminal, the inventive concept is not limited thereto, and the series capacitor C5 may be connected between another parallel capacitor and the ground terminal. When the series capacitor C5 is connected between a parallel capacitor other than the fourth parallel capacitor C4 and the ground terminal, connections of the plurality of switches S1 to S6 may also be partially changed. However, an embodiment in which the series capacitor C5 is connected between the fourth parallel capacitor C4 and the ground terminal is mainly described.

In an embodiment, the series capacitor C5 may have the same capacitor value as the first to fourth parallel capacitors C1 to C4. In this case, the controller 330 may increase the matching impedance value by the second adjustment value, which is less than the first adjustment value, by connecting the series capacitor C5 to the fourth parallel capacitor C4. The matching impedance value may have discrete values based on the electrical connections of the plurality of capacitors.

As described above, the first to fourth parallel capacitors C1 to C4 and the series capacitor C5 may all have the same value. However, the first to fourth parallel capacitors C1 to C4 and the series capacitor C5 may each have different values, or only some of the first to fourth parallel capacitors C1 to C4 and the series capacitor C5 may have the same value.

In various embodiments, the connection states of the plurality of switches S1 to S6 may be adjusted based on a switching signal received from the controller 330. The plurality of switches S1 to S6 may be in a turn-on state (electrically connected state) or a turn-off state (electrically open state), according to the switching signal. The plurality of switches S1 to S6 may each be implemented as electronic devices, such as a metal oxide semiconductor field effect transistor (MOSFET), a bipolar junction transistor (BJT), and the like, but are not limited thereto.

In various embodiments, the plurality of switches S1 to S6 may include a plurality of parallel switches, that is, first to fourth parallel switches S1 to S4, a series switch S5, and an intermediate switch S6.

In various embodiments, the first to fourth parallel switches S1 to S4 may adjust connections of the first to fourth parallel capacitors C1 to C4 based on the switching signal. In the embodiment of FIG. 3, the first parallel switch S1 may alter the electrical connection of the first parallel capacitor C1, the second parallel switch S2 may alter the electrical connection of the second parallel capacitor C2, the third parallel switch S3 may alter the electrical connection of the third parallel capacitor C3, and the fourth parallel switch S4 may alter the electrical connection of the fourth parallel capacitor C4.

In various embodiments, the series switch S5 may alter an electrical connection of the series capacitor C5 based on the switching signal.

In various embodiments, the intermediate switch S6 may alter an electrical connection between a parallel capacitor (the fourth parallel capacitor C4 in the embodiment of FIG. 3) connected to the series capacitor C5, among the first to fourth parallel capacitors C1 to C4, and the remaining parallel capacitors (the first to third parallel capacitors C1 to C3 in the embodiment of FIG. 3), based on the switching signal.

In various embodiments, the plurality of switches S1 to S6 may form different electrical connections according to the switching signal received from the controller 330, thereby changing the matching impedance value. As illustrated in FIG. 3, when the plurality of switches S1 to S6 are all in the turn-off state according to the switching signal received from the controller 330, the matching impedance value may be 0Ω.

Changes in the matching impedance value according to the connection states of the plurality of switches S1 to S6 may be described with reference to FIGS. 4 to 7.

Figure 4:
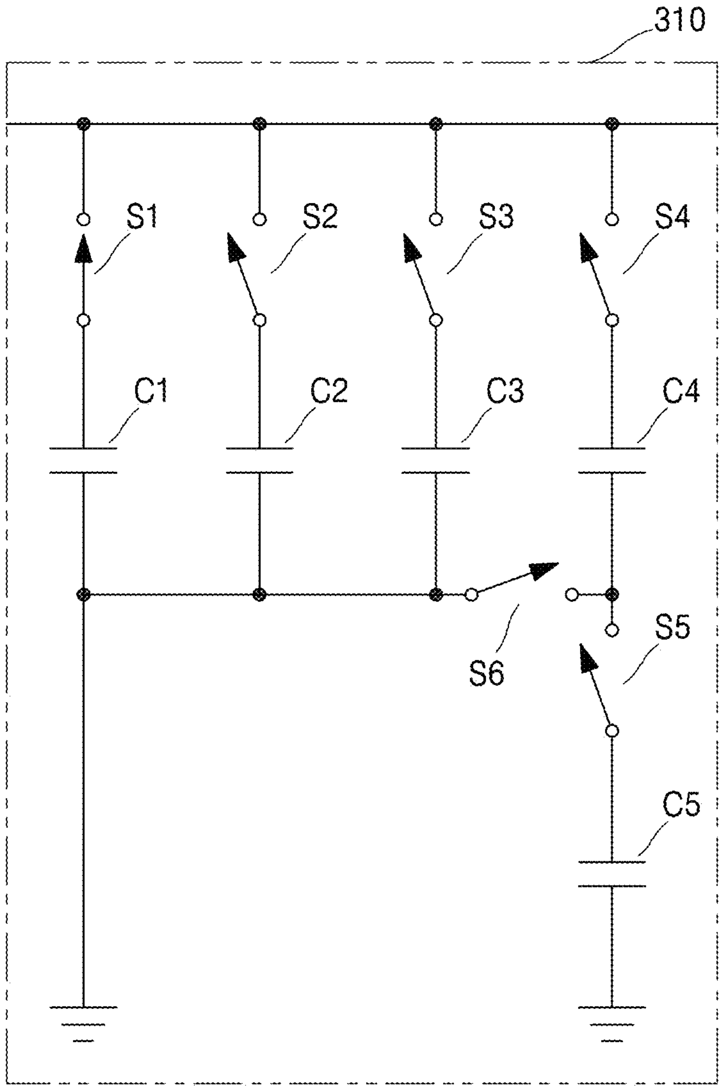
FIG. 4 is a circuit diagram illustrating a connection of a switch when a matching impedance value of a matching circuit of an electronic device is 1Ω, according to an embodiment.

FIG. 4 is a circuit diagram illustrating a connection of a switch when the matching impedance value of the matching circuit 310 of the electronic device 10 is 1Ω, according to an embodiment.

Referring to FIG. 4, a connection of a switch when the matching impedance value of the matching circuit 310 is 1 C may be seen. In this case, the plurality of capacitors C1 to C5 may all have an impedance value of 1Ω.

In various embodiments, the controller 330 may adjust the first parallel switch S1 to be in the turn-on state and adjust the second to fourth parallel switches S2 to S4, the series switch S5, and the intermediate switch S6 to be in the turn-off state, through a switching signal. In this case, only the first parallel capacitor C1 may affect the matching impedance value of the matching circuit 310, and the matching impedance value of the matching circuit 310 may be 1Ω.

However, unlike the illustration of FIG. 4, the controller 330 may adjust the second parallel switch S2 to be in the turn-on state and adjust the first parallel switch S1, the third parallel switch S3, the fourth parallel switch S4, the series switch S5, and the intermediate switch S6 to be in the turn-off state, thereby setting the matching impedance value of the matching circuit 310 to 1Ω. Also, unlike the illustration of FIG. 4, the controller 330 may adjust the third parallel switch S3 to be in the turn-on state and adjust the first and second parallel switches S1 and S2, the fourth parallel switch S4, the series switch S5, and the intermediate switch S6 to be in the turn-off state, thereby setting the matching impedance value of the matching circuit 310 to 1Ω. Also, unlike the illustration of FIG. 4, the controller 330 may adjust the fourth parallel switch S4 and the intermediate switch S6 to be in the turn-on state and adjust the first to third parallel switches S1 to S3 and the series switch S5 to be in the turn-off state, thereby setting the matching impedance value of the matching circuit 310 to 1Ω.

Figure 5:
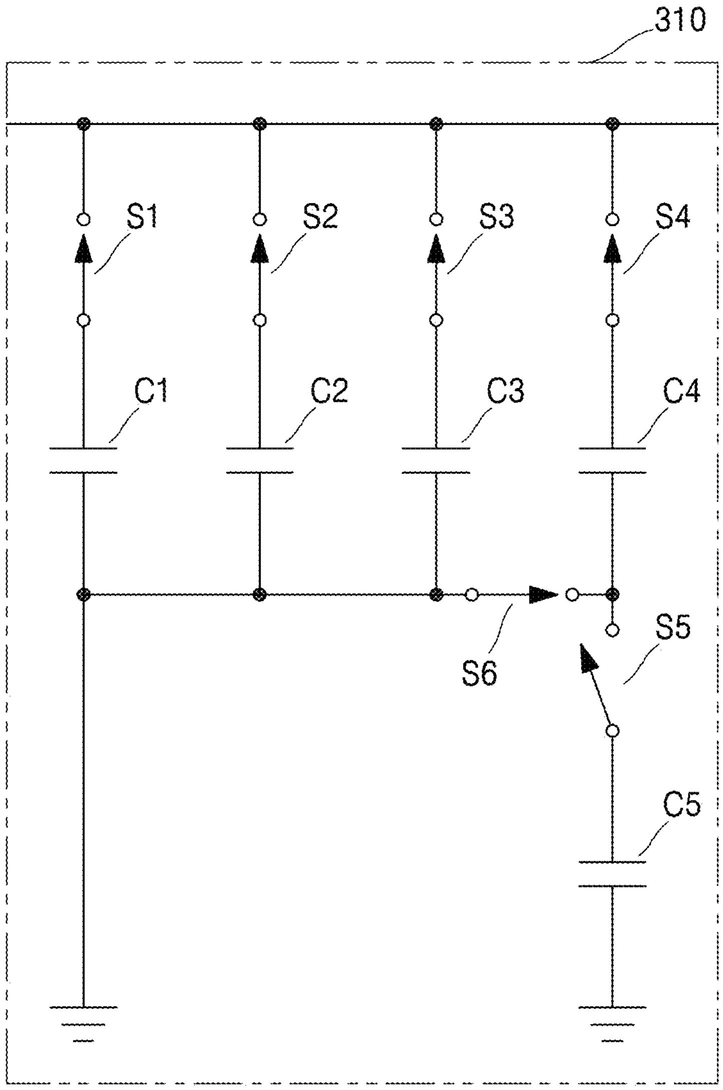
FIG. 5 is a circuit diagram illustrating a connection of a switch when a matching impedance value of a matching circuit of an electronic device is 4Ω, according to an embodiment.

FIG. 5 is a circuit diagram illustrating a connection of a switch when the matching impedance value of the matching circuit 310 of the electronic device 10 is 4Ω, according to an embodiment.

Referring to FIG. 5, a connection of a switch when the matching impedance value of the matching circuit 310 is 4Ω may be seen. In this case, in the embodiment of FIG. 5, the plurality of capacitors C1 to C5 may all have an impedance value of 1Ω.

In various embodiments, the controller 330 may adjust the first to fourth parallel switches S1 to S4 and the intermediate switch S6 be in the turn-on state and adjust the series switch S5 to be in the turn-off state, through a switching signal. In this case, the first to fourth parallel capacitors C1 to C4 may affect the matching impedance value of the matching circuit 310, and the matching impedance value of the matching circuit 310 may be 4Ω.

Figure 6:
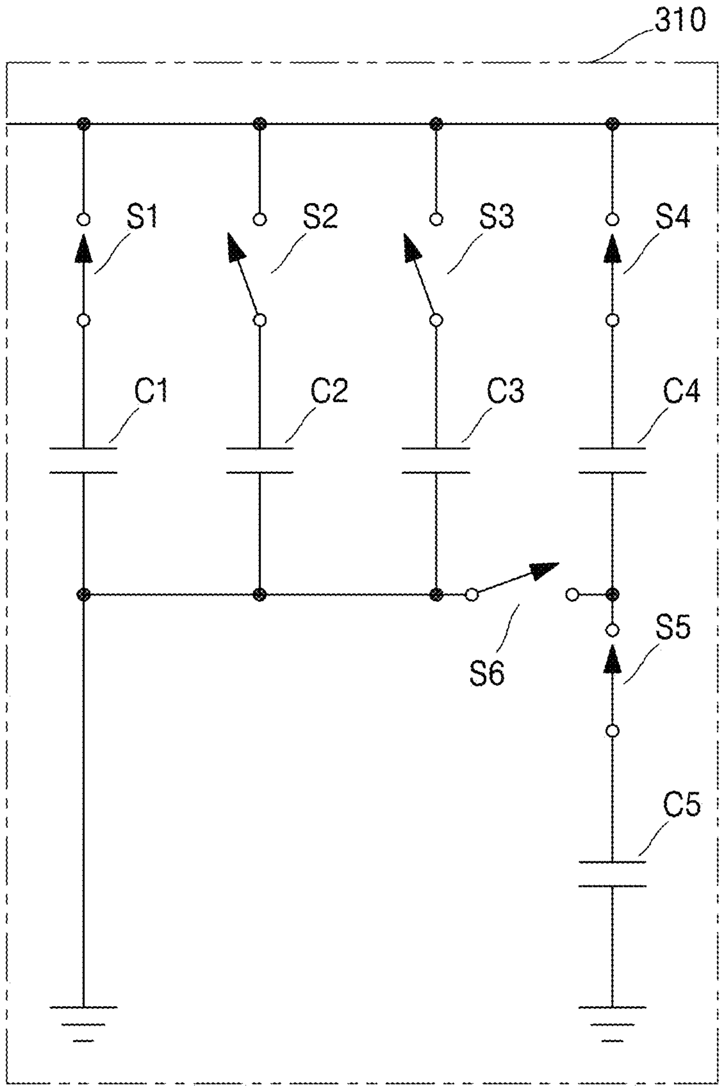
FIG. 6 is a circuit diagram illustrating a connection of a switch when a matching impedance value of a matching circuit of an electronic device is 1.5Ω, according to an embodiment.

FIG. 6 is a circuit diagram illustrating connection of a switch when the matching impedance value of the matching circuit 310 of the electronic device 10 is 1.5Ω, according to an embodiment.

Referring to FIG. 6, a connection of a switch when the matching impedance value of the matching circuit 310 is 1.5Ω may be seen. In this case, the plurality of capacitors C1 to C5 may all have an impedance value of 1Ω.

In various embodiments, the controller 330 may adjust the first parallel switch S1, the fourth parallel switch S4, and the series switch S5 to be in the turn-on state and adjust the second parallel switch S2, the third parallel switch S3, and the intermediate switch S6 to be in the turn-off state, through a switching signal. In this case, the first parallel capacitor C1, the fourth parallel capacitor C4, and the series capacitor C5 may affect the matching impedance value of the matching circuit 310, and the matching impedance value of the matching circuit 310 may be 1.5Ω.

However, unlike the illustration of FIG. 6, the controller 330 may adjust the second parallel switch S2, the fourth parallel switch S4, and the series switch S5 to be in the turn-on state and adjust the first parallel switch S1, the third parallel switch S3, and the intermediate switch S6 to be in the turn-off state, thereby setting the matching impedance value of the matching circuit 310 to 1.5Ω. Also, unlike the illustration of FIG. 6, the controller 330 may adjust the third parallel switch S3, the fourth parallel switch S4, and the series switch S5 to be in the turn-on state and adjust the first parallel switch S1, the second parallel switch S2, and the intermediate switch S6 to be in the turn-off state, thereby setting the matching impedance value of the matching circuit 310 to 1.5Ω.

FIG. 7 is a table illustrating a relationship between the matching impedance value of the matching circuit 310 of the electronic device 10 and a connection state of a switch, according to an embodiment.

Referring to FIG. 7, a table showing matching impedance values according to the connection states of the plurality of switches S1 to S6 when the matching circuit 310 included in the electronic device 10 has the structure illustrated in FIG. 3 and the plurality of capacitors C1 to C5 all have an impedance value of 1Ω may be seen. The controller 330 may adjust the matching impedance value of the matching circuit 310 based on the table illustrated in FIG. 7.

In more detail, the controller 330 may adjust the matching impedance value of the matching circuit 310 to 0Ω by transmitting a switching signal such that all connection states of the plurality of switches S1 to S6 become the turn-off state.

In various embodiments, the controller 330 may adjust the matching impedance value of the matching circuit 310 to 1Ω by transmitting a switching signal such that the connection state of the first parallel switch S1 becomes the turn-on state and the connection states of the second to fourth parallel switches S2 to S4, the series switch S5, and the intermediate switch S6 become the turn-off state.

In various embodiments, the controller 330 may adjust the matching impedance value of the matching circuit 310 to 1.5Ω by transmitting a switching signal such that the connection states of the first parallel switch S1, the fourth parallel switch S4, and the series switch S5 become the turn-on state and the connection states of the second parallel switch S2, the third parallel switch S3, and the intermediate switch S6 become the turn-off state.

In various embodiments, the controller 330 may adjust the matching impedance value of the matching circuit 310 to 2Ω by transmitting a switching signal such that the connection states of the first parallel switch S1 and the second parallel switch S2 become the turn-on state and the connection states of the third parallel switch S3, the fourth parallel switch S4, the series switch S5, and the intermediate switch S6 become the turn-off state.

In various embodiments, the controller 330 may adjust the matching impedance value of the matching circuit 310 to 2.5Ω by transmitting a switching signal such that the connection states of the first parallel switch S1, the second parallel switch S2, the fourth parallel switch S4, and the series switch S5 become the turn-on state and the connection states of the third parallel switch S3 and the intermediate switch S6 become the turn-off state.

In various embodiments, the controller 330 may adjust the matching impedance value of the matching circuit 310 to 3Ω by transmitting a switching signal such that the connection states of the first to third parallel switches S1 to S3 become the turn-on state and the connection states of the fourth parallel switch S4, the series switch S5, and the intermediate switch S6 become the turn-off state.

In various embodiments, the controller 330 may adjust the matching impedance value of the matching circuit 310 to 3.5Ω by transmitting a switching signal such that the connection states of the first to fourth parallel switches S1 to S4 and the series switch S5 become the turn-on state and the connection state of the intermediate switch S6 becomes the turn-off state.

In various embodiments, the controller 330 may adjust the matching impedance value of the matching circuit 310 to 4Ω by transmitting a switching signal such that the connection states of the first to fourth parallel switches S1 to S4 and the intermediate switch S6 become the turn-on state and the connection state of the series switch S5 becomes the turn-off state.

When the plurality of capacitors C1 to C5 all have different impedance values or only some of the plurality of capacitors C1 to C5 have the same impedance value, the controller 330 may adjust the matching impedance value of the matching circuit 310 based on a table that is set differently from that of FIG. 7.

Figure 8:
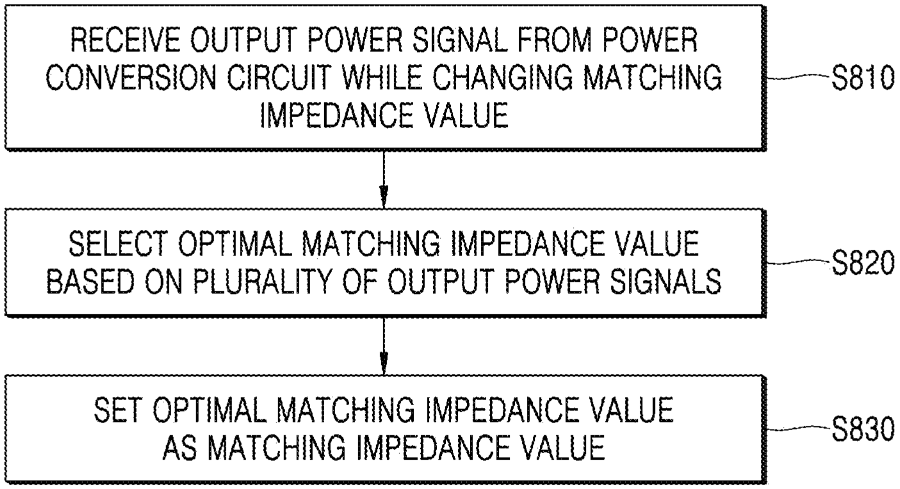
FIG. 8 is a flowchart illustrating an operating method of an electronic device according to an embodiment.

FIG. 8 is a flowchart illustrating an operating method of the electronic device 10 according to an embodiment.

Referring to FIG. 8, in operation S810, the electronic device 10 may receive an output power signal from the power conversion circuit 320 while changing a matching impedance value of the matching circuit 310.

In various embodiments, the electronic device 10 may set the matching impedance value of the matching circuit 310 through a switching signal and may receive an output power signal corresponding to the set matching impedance value. The electronic device 10 may change the matching impedance value of the matching circuit 310 by transmitting a subsequent switching signal to the matching circuit 310 and may receive an output power signal corresponding to the changed matching impedance value. A more detailed embodiment of operation S810 is described below with reference to FIG. 9.

In operation S820, the electronic device 10 may select an optimal matching impedance value based on a plurality of output power signals.

In various embodiments, the electronic device 10 may select, as the optimal matching impedance value, a matching impedance value corresponding to an output power signal having a maximum voltage value among the plurality of output power signals.

In operation S830, the electronic device 10 may set the optimal matching impedance value as the matching impedance value.

As such, the electronic device 10 according to an embodiment may set the matching circuit 310 to have a matching impedance value corresponding to the output power signal having the maximum voltage value, thereby receiving power from an external wireless power transmission device with high efficiency.

Figure 9:
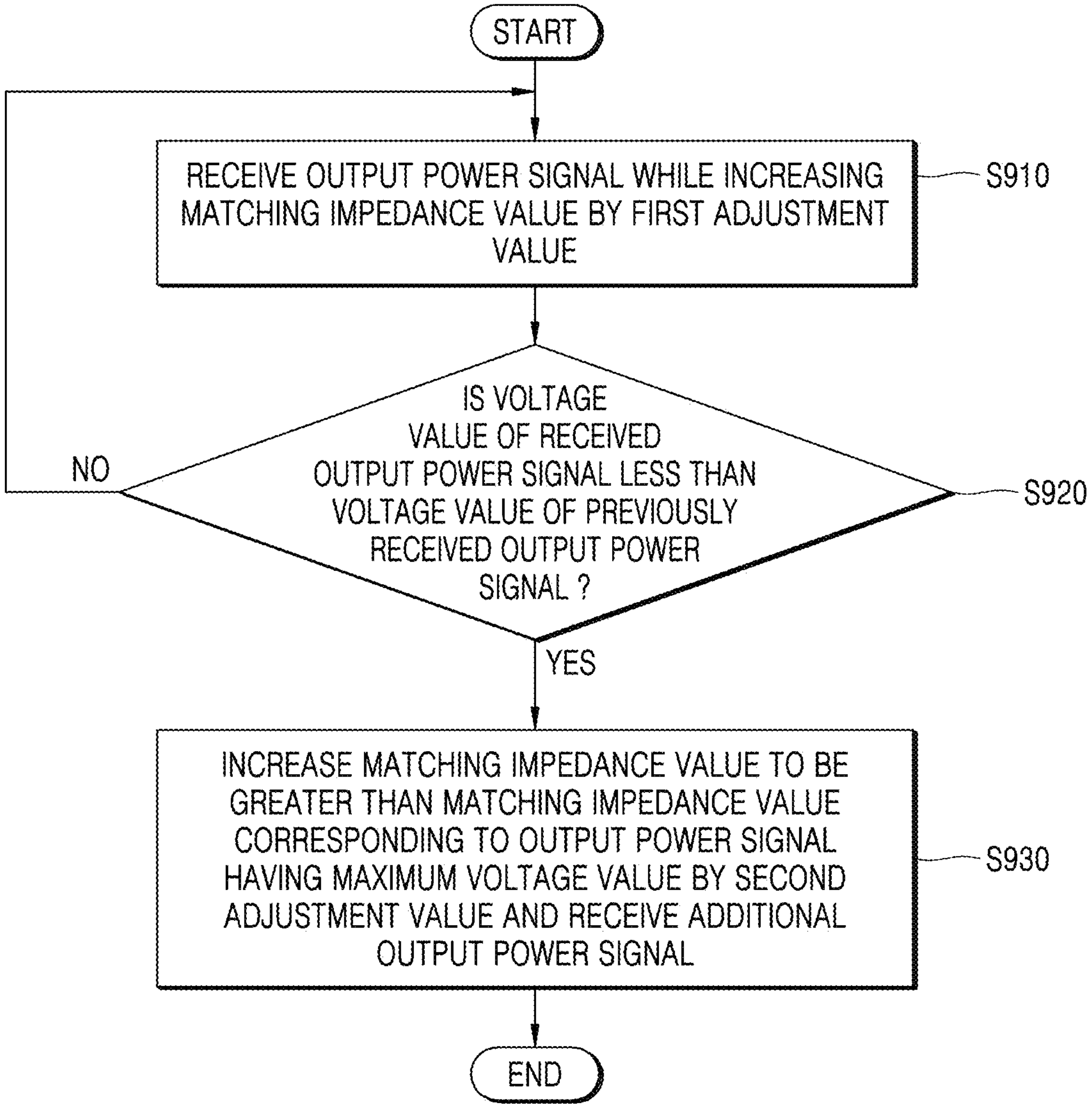
FIG. 9 is a flowchart illustrating operation S810 of FIG. 8 in more detail.

FIG. 9 is a flowchart illustrating operation S810 of FIG. 8 in more detail.

Referring to FIG. 9, in operation S910, the electronic device 10 may receive an output power signal while increasing the matching impedance value by a first adjustment value.

For example, when the first adjustment value is 1Ω, the electronic device 10 may receive the output power signal while increasing the matching impedance value from 0Ω by 1Ω.

In operation S920, the electronic device 10 may determine whether a voltage value of the received output power signal is less than a voltage value of a previously received output power signal.

In response to a determination that the voltage value of the received output power signal is greater than or equal to the voltage value of the previously received output power signal, returning to operation S910, the electronic device 10 may continue to receive the output power signal while increasing the matching impedance value by the first adjustment value.

In contrast, in response to a determination that the voltage value of the received output power signal is less than the voltage value of the previously received output power signal, moving to operation S930, the electronic device 10 may increase the matching impedance value to be greater than the matching impedance value corresponding to the output power signal having the maximum voltage value by a second adjustment value and receive an additional output power signal.

As such, the electronic device 10 according to an embodiment may select the optimal matching impedance value based on an additional output power signal received based on a matching impedance value adjusted by using the second adjustment value that is less than the first adjustment value, thereby finely adjusting the matching impedance value of the matching circuit 310. The second adjustment value may be an intermediate value less than 1Ω.

Figure 10:
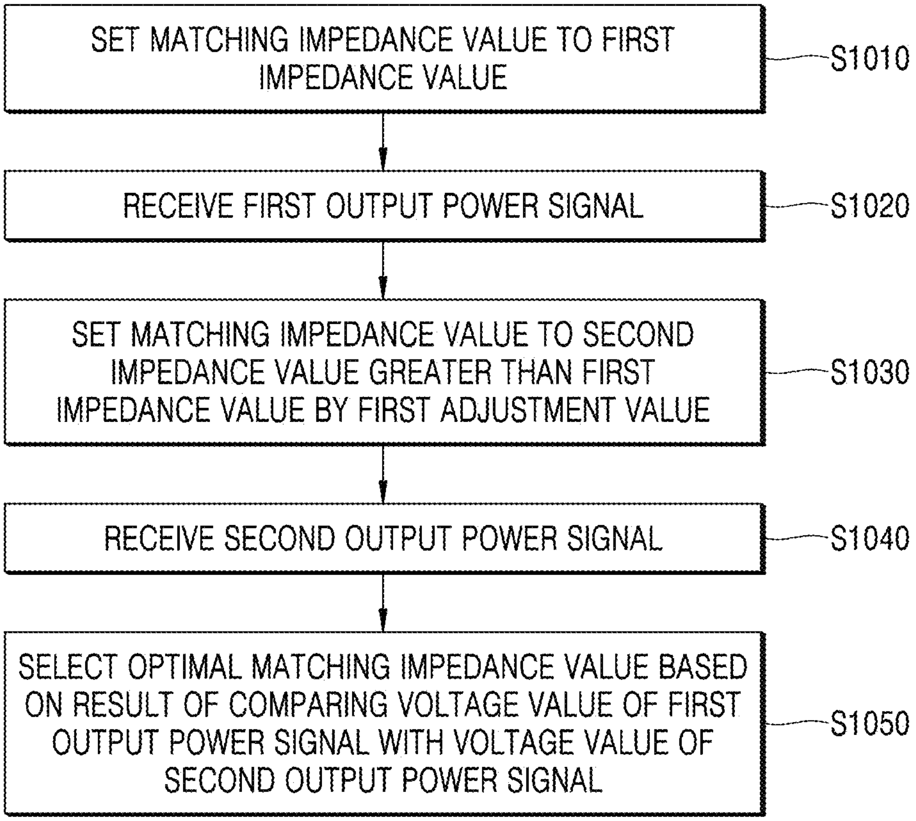
FIG. 10 is a flowchart illustrating an operating method of an electronic device when a matching circuit of the electronic device is as illustrated in FIG. 3, according to an embodiment.

FIG. 10 is a flowchart illustrating an operating method of the electronic device 10 when the matching circuit 310 of the electronic device 10 is as illustrated in FIG. 3, according to an embodiment.

Referring to FIG. 10, an example of the operating method of the electronic device 10, in which the matching circuit 310 of the electronic device 10 has the structure illustrated in FIG. 3, the plurality of capacitors C1 to C5 have an impedance value of 1 C, the first adjustment value is 1Ω, and the second adjustment value is 0.5Ω, may be seen.

In operation S1010, the electronic device 10 may set the matching impedance value to a first impedance value. In this case, the first impedance value may be the minimum matching impedance value that the matching circuit 310 may have and may be 0Ω. The electronic device 10 may set the matching impedance value to 0Ω by adjusting all of the plurality of switches S1 to S6 included in the matching circuit 310 to be in the turn-off state, where the matching circuit 310 may form an electrical short between the terminals.

In operation S1020, the electronic device 10 may receive a first output power signal. The first output power signal may be an output power signal generated by the power conversion circuit 320 when the matching impedance value is 0Ω.

In operation S1030, the electronic device 10 may set the matching impedance value to a second impedance value that is greater than the first impedance value by the first adjustment value. In this case, the second impedance value may be 1Ω, which is greater than the first impedance value by the first adjustment value. The electronic device 10 may set the matching impedance value to 1Ω by adjusting the first parallel switch S1 included in the matching circuit 310 to be in the turn-on state and adjusting the second to fourth parallel switches S2 to S4, the series switch S5, and the intermediate switch S6 included in the matching circuit 310 to be in the turn-off state.

In operation S1040, the electronic device 10 may receive a second output power signal. The second output power signal may be an output power signal generated by the power conversion circuit 320 when the matching impedance value is 1Ω.

In operation S1050, the electronic device 10 may select the optimal matching impedance value based on a result of comparing a voltage value of the first output power signal with a voltage value of the second output power signal. Operation S1050 may be described in more detail with reference to FIG. 11.

Figure 11:
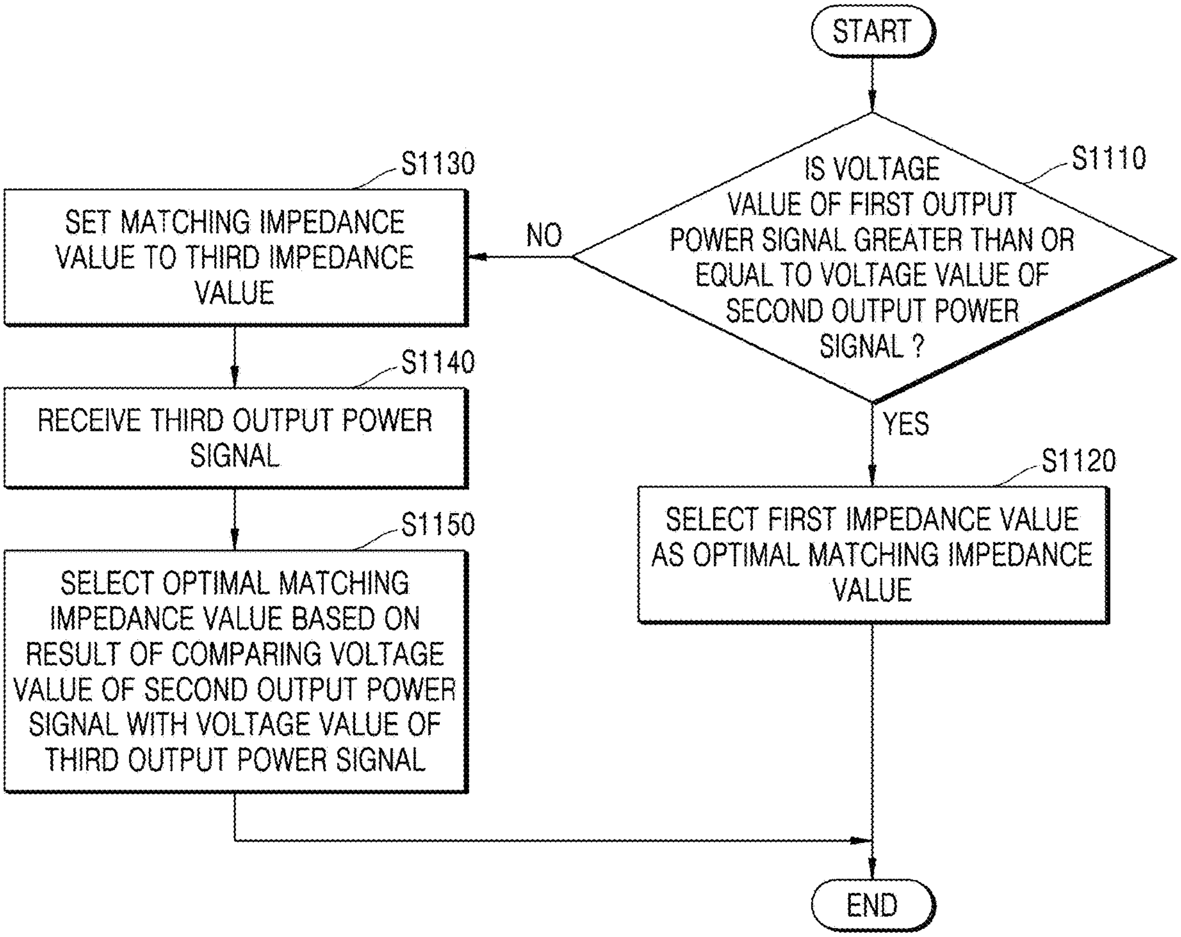
FIG. 11 is a flowchart illustrating operation S1050 of FIG. 10 in more detail.

FIG. 11 is a flowchart illustrating operation S1050 of FIG. 10 in more detail.

Referring to FIG. 11, in operation S1110, the electronic device 10 may determine whether or not the voltage value of the first output power signal is greater than or equal to the voltage value of the second output power signal.

In response to a determination that the voltage value of the first output power signal is greater than or equal to the voltage value of the second output power signal, moving to operation S1120, the electronic device 10 may select 0Ω, which is the first impedance value, as the optimal matching impedance value.

In contrast, in response to a determination that the voltage value of the first output power signal is less than the voltage value of the second output power signal, moving to operation S1130, the electronic device 10 may set the matching impedance value to a third impedance value that is greater than the second impedance value by the first adjustment value. In this case, the third impedance value may be 2Ω, which is greater than the second impedance value by the first adjustment value. The electronic device 10 may set the matching impedance value to 2Ω by adjusting the first parallel switch S1 and the second parallel switch S2 included in the matching circuit 310 to be in the turn-on state and adjusting the third parallel switch S3, the fourth parallel switch S4, the series switch S5, and the intermediate switch S6 included in the matching circuit 310 to be in the turn-off state.

In operation S1140, the electronic device 10 may receive a third output power signal. The third output power signal may be an output power signal generated by the power conversion circuit 320 when the matching impedance value is 2Ω.

In operation S1150, the electronic device 10 may select the optimal matching impedance value based on a result of comparing the voltage value of the second output power signal with a voltage value of the third output power signal. Operation S1150 may be described in more detail with reference to FIG. 12.

Figure 12:
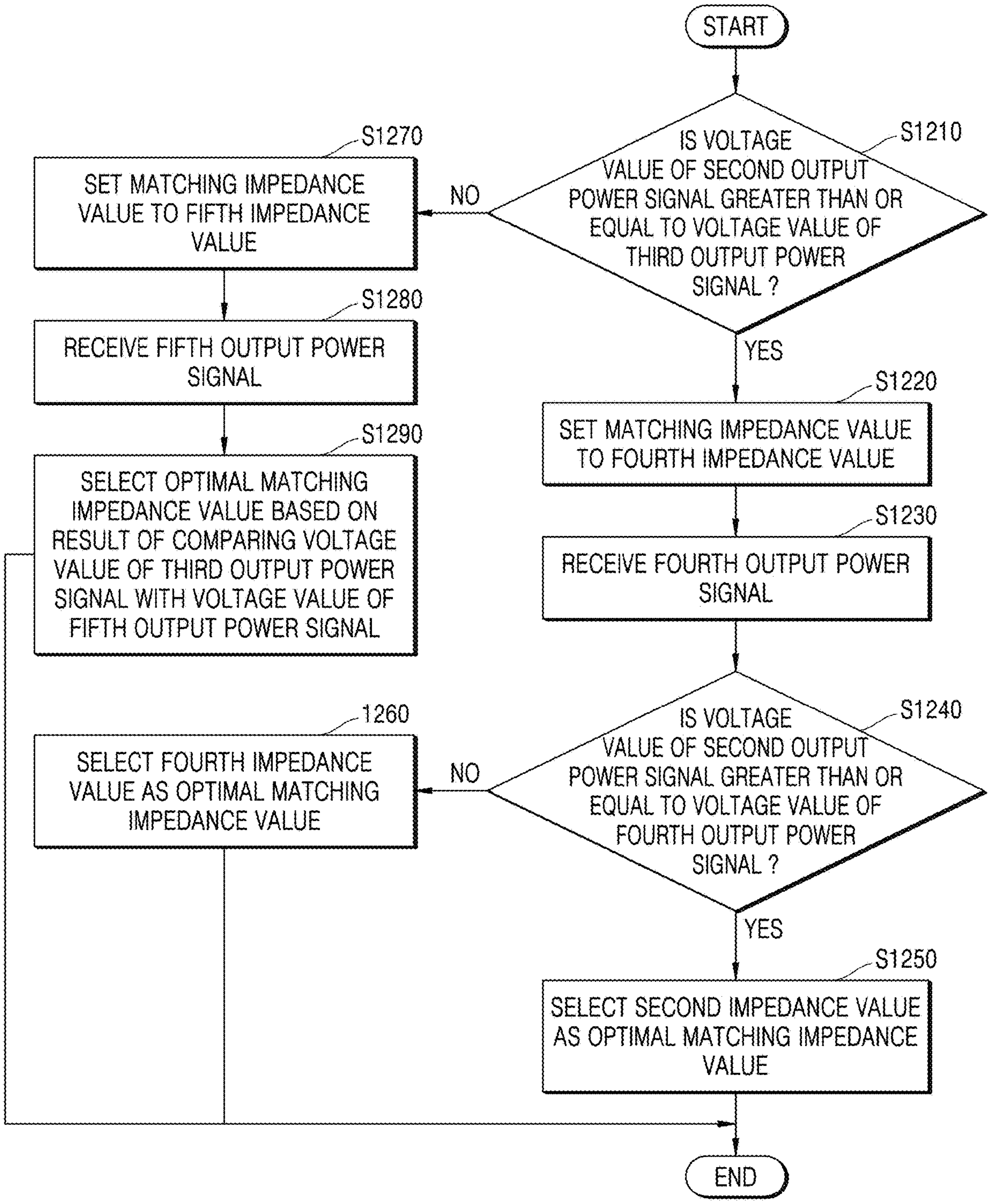
FIG. 12 is a flowchart illustrating operation S1150 of FIG. 11 in more detail.

FIG. 12 is a flowchart illustrating operation S1150 of FIG. 11 in more detail.

Referring to FIG. 12, in operation S1210, the electronic device 10 may determine whether or not the voltage value of the second output power signal is greater than or equal to the voltage value of the third output power signal.

In response to a determination that the voltage value of the second output power signal is greater than or equal to the voltage value of the third output power signal, moving to operation S1220, the electronic device 10 may set the matching impedance value to a fourth impedance value that is greater than the second impedance value by the second adjustment value. In this case, the fourth impedance value may be 1.5Ω, which is greater than the second impedance value by the second adjustment value. The electronic device 10 may set the matching impedance value to 1.5Ω by adjusting the first parallel switch S1, the fourth parallel switch S4, and the series switch S5 included in the matching circuit 310 to be in the turn-on state and adjusting the second parallel switch S2, the third parallel switch S3, and the intermediate switch S6 included in the matching circuit 310 to be in the turn-off state.

In operation S1230, the electronic device 10 may receive a fourth output power signal. The fourth output power signal may be an output power signal generated by the power conversion circuit 320 when the matching impedance value is 1.5Ω.

In operation S1240, the electronic device 10 may determine whether or not the voltage value of the second output power signal is greater than or equal to a voltage value of the fourth output power signal.

In response to a determination that the voltage value of the second output power signal is greater than or equal to the voltage value of the fourth output power signal, moving to operation S1250, the electronic device 10 may select 1Ω, which is the second impedance value, as the optimal matching impedance value.

In contrast, in response to a determination that the voltage value of the second output power signal is less than the voltage value of the fourth output power signal, moving to operation S1260, the electronic device 10 may select 1.5Ω, which is the fourth impedance value, as the optimal matching impedance value.

Returning to operation S1210, in response to a determination that the voltage value of the second output power signal is less than the voltage value of the third output power signal, moving to operation S1270, the electronic device 10 may set the matching impedance value to a fifth impedance value that is greater than the third impedance value by the first adjustment value. In this case, the fifth impedance value may be 3Ω, which is greater than the third impedance value by the first adjustment value. The electronic device 10 may set the matching impedance value to 3Ω by adjusting the first to third parallel switches S1 to S3 included in the matching circuit 310 to be in the turn-on state and adjusting the fourth parallel switch S4, the series switch S5, and the intermediate switch S6 included in the matching circuit 310 to be in the turn-off state.

In operation S1280, the electronic device 10 may receive a fifth output power signal. The fifth output power signal may be an output power signal generated by the power conversion circuit 320 when the matching impedance value is 3Ω.

In operation S1290, the electronic device 10 may select the optimal matching impedance value based on a result of comparing the voltage value of the third output power signal with a voltage value of the fifth output power signal. Operation S1290 may be described in more detail with reference to FIG. 13.

Figure 13:
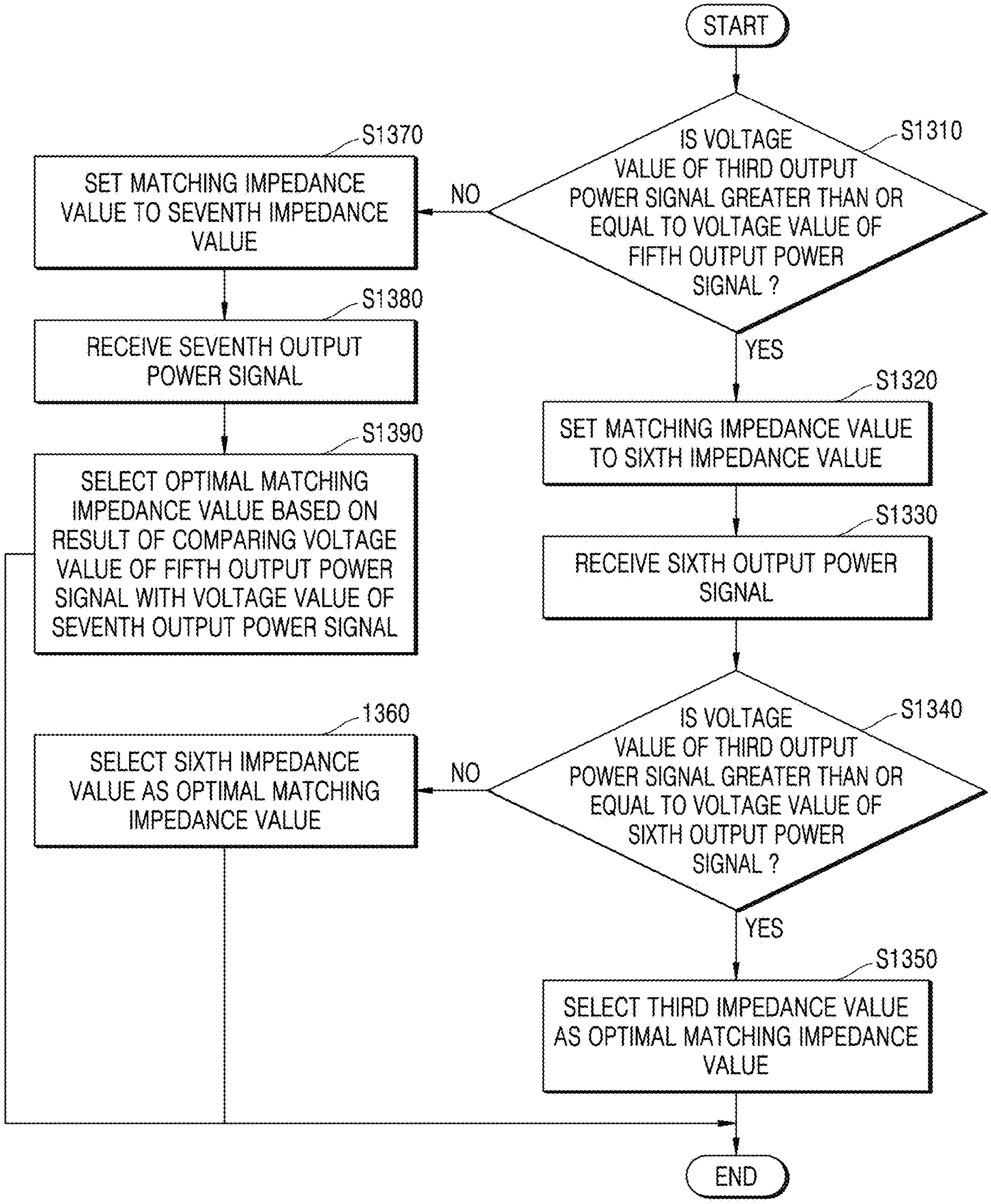
FIG. 13 is a flowchart illustrating operation S1290 of FIG. 12 in more detail.

FIG. 13 is a flowchart illustrating operation S1290 of FIG. 12 in more detail.

Referring to FIG. 13, in operation S1310, the electronic device 10 may determine whether or not the voltage value of the third output power signal is greater than or equal to the voltage value of the fifth output power signal.

In response to a determination that the voltage value of the third output power signal is greater than or equal to the voltage value of the fifth output power signal, moving to operation S1320, the electronic device 10 may set the matching impedance value to a sixth impedance value that is greater than the third impedance value by the second adjustment value. In this case, the sixth impedance value may be 2.5Ω, which is greater than the third impedance value by the second adjustment value. The electronic device 10 may set the matching impedance value to 2.5Ω by adjusting the first parallel switch S1, the second parallel switch S2, the fourth parallel switch S4, and the series switch S5 included in the matching circuit 310 to be in the turn-on state and adjusting the third parallel switch S3 and the intermediate switch S6 included in the matching circuit 310 to be in the turn-off state.

In operation S1330, the electronic device 10 may receive a sixth output power signal. The sixth output power signal may be an output power signal generated by the power conversion circuit 320 when the matching impedance value is 2.5Ω.

In operation S1340, the electronic device 10 may determine whether or not the voltage value of the third output power signal is greater than or equal to a voltage value of the sixth output power signal.

In response to a determination that the voltage value of the third output power signal is greater than or equal to the voltage value of the sixth output power signal, moving to operation S1350, the electronic device 10 may select 2Ω, which is the third impedance value, as the optimal matching impedance value.

In contrast, in response to a determination that the voltage value of the third output power signal is less than the voltage value of the sixth output power signal, moving to operation S1360, the electronic device 10 may select 2.5Ω, which is the sixth impedance value, as the optimal matching impedance value.

Returning to operation S1310, in response to a determination that the voltage value of the third output power signal is less than the voltage value of the fifth output power signal, moving to operation S1370, the electronic device 10 may set the matching impedance value to a seventh impedance value that is greater than the fifth impedance value by the first adjustment value. In this case, the seventh impedance value may be 4Ω, which is greater than the fifth impedance value by the first adjustment value. The electronic device 10 may set the matching impedance value to 4Ω by adjusting the first to fourth parallel switches S1 to S4 and the intermediate switch S6 included in the matching circuit 310 to be in the turn-on state and adjusting the series switch S5 included in the matching circuit 310 to be in the turn-off state.

In operation S1380, the electronic device 10 may receive a seventh output power signal. The seventh output power signal may be an output power signal generated by the power conversion circuit 320 when the matching impedance value is 4Ω.

In operation S1390, the electronic device 10 may select the optimal matching impedance value based on a result of comparing the voltage value of the fifth output power signal with a voltage value of the seventh output power signal. Operation S1390 may be described in more detail with reference to FIG. 14.

Figure 14:
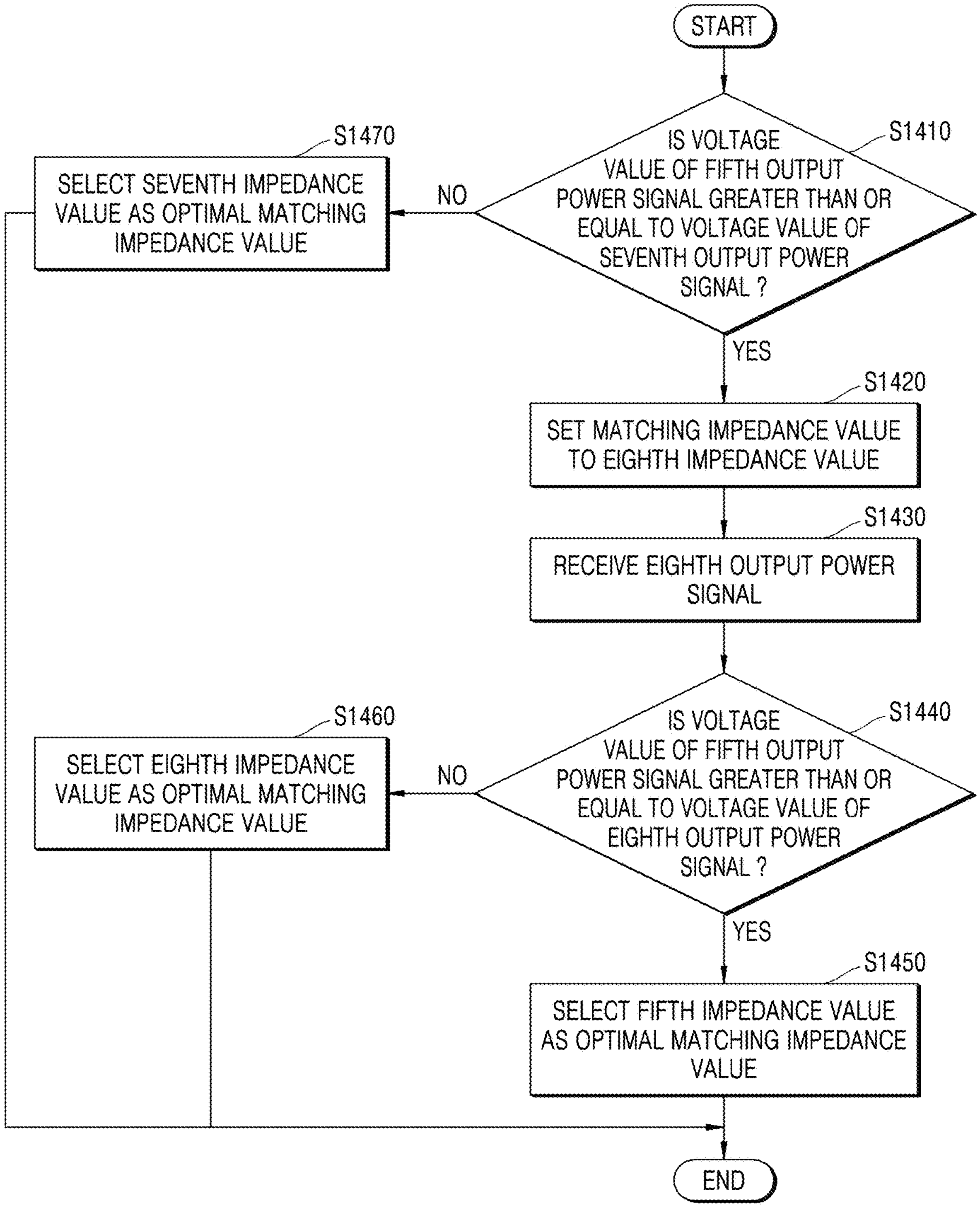
FIG. 14 is a flowchart illustrating operation S1390 of FIG. 13 in more detail.

FIG. 14 is a flowchart illustrating operation S1390 of FIG. 13 in more detail.

Referring to FIG. 14, in operation S1410, the electronic device 10 may determine whether or not the voltage value of the fifth output power signal is greater than or equal to the voltage value of the seventh output power signal.

In response to a determination that the voltage value of the fifth output power signal is greater than or equal to the voltage value of the seventh output power signal, moving to operation S1420, the electronic device 10 may set the matching impedance value to an eighth impedance value that is greater than the fifth impedance value by the second adjustment value. In this case, the eighth impedance value may be 3.5 C, which is greater than the fifth impedance value by the second adjustment value. The electronic device 10 may set the matching impedance value to 3.5 C by adjusting the first to fourth parallel switches S1 to S4 and the series switch S5 included in the matching circuit 310 to be in the turn-on state and adjusting the intermediate switch S6 included in the matching circuit 310 to be in the turn-off state.

In operation S1430, the electronic device 10 may receive an eighth output power signal. The eighth output power signal may be an output power signal generated by the power conversion circuit 320 when the matching impedance value is 3.5 C.

In operation S1440, the electronic device 10 may determine whether or not the voltage value of the fifth output power signal is greater than or equal to a voltage value of the eighth output power signal.

In response to a determination that the voltage value of the fifth output power signal is greater than or equal to the voltage value of the eighth output power signal, moving to operation S1450, the electronic device 10 may select 3Ω, which is the fifth impedance value, as the optimal matching impedance value.

In contrast, in response to a determination that the voltage value of the fifth output power signal is less than the voltage value of the eighth output power signal, moving to operation S1460, the electronic device 10 may select 3.5Ω, which is the eighth impedance value, as the optimal matching impedance value.

Returning to operation S1410, in response to a determination that the voltage value of the fifth output power signal is less than the voltage value of the seventh output power signal, moving to operation S1470, the electronic device 10 may select 4Ω, which is the seventh impedance value, as the optimal matching impedance value. This is because the maximum matching impedance value that the matching circuit 310 may have is 4Ω.

When using the electronic device 10 according to the embodiment and the operating method thereof as described above, by setting the matching circuit 310 to have a matching impedance value corresponding to the output power signal having the maximum voltage value, power may be received from an external wireless power transmission device with high efficiency. Also, by selecting the optimal matching impedance value based on an additional output power signal received based on a matching impedance value adjusted by using the second adjustment value that is less than the first adjustment value, the matching impedance value of the matching circuit 310 may be finely adjusted.

While the inventive concept has been particularly shown and described with reference to embodiments thereof, it will be understood that various changes in form and details may be made therein without departing from the spirit and scope of the disclosure and following claims.

What is claimed is:

1. An electronic device comprising:

a matching circuit comprising a plurality of capacitors and a plurality of switches, having different matching impedance values according to connection states of the plurality of switches, and configured to output a matching power signal by impedance matching an input power signal;

a power conversion circuit configured to convert the matching power signal in an alternating current (AC) form into an output power signal in a direct current (DC) form; and a controller configured to set the matching impedance value of the matching circuit by transmitting a switching signal to the plurality of switches, wherein the switching signal sets the connection state of the plurality of switches, and wherein the controller is further configured to:

receive the output power signal from the power conversion circuit, while increasing the matching impedance value by a first adjustment value, select an optimal matching impedance value based on a plurality of output power signals that are received from the power conversion circuit;

set, as the matching impedance value, an impedance value that is greater than a matching impedance value corresponding to an output power signal having a maximum voltage value among the plurality of output power signals by a second adjustment value, and receive an additional output power signal from the power conversion circuit in response to a voltage value of the received output power signal being less than a voltage value of a previously received output power signal;

select, as the optimal matching impedance value, a matching impedance value corresponding to a greater value of the maximum voltage value of the plurality of output power signals and a voltage value of the additional output power signal, wherein the second adjustment value is less than the first adjustment value; and set the optimal matching impedance value as the matching impedance value.

2. The electronic device of claim 1, wherein the controller is further configured to stop receiving the output power signal from the power conversion circuit in response to a voltage value of the received output power signal being less than a voltage value of a previously received output power signal.

3. The electronic device of claim 1, wherein the plurality of capacitors comprise:

a plurality of parallel capacitors connected to each other in parallel between a ground terminal and an input terminal; and a series capacitor connected in series between one of the plurality of parallel capacitors and the ground terminal, and the plurality of switches comprise:

a plurality of parallel switches configured to adjust electrical connections of the plurality of parallel capacitors based on the switching signal;

a series switch configured to alter an electrical connection of the series capacitor to the one of the plurality of parallel capacitors based on the switching signal; and an intermediate switch configured to adjust, based on the switching signal, a connection between a parallel capacitor connected to the series capacitor among the plurality of parallel capacitors and remaining parallel capacitors.

4. An electronic device comprising:

a matching circuit comprising a plurality of capacitors and a plurality of switches, having different matching impedance values according to connection states of the plurality of switches, and configured to output a matching power signal by impedance matching an input power signal;

a power conversion circuit configured to convert the matching power signal in an alternating current (AC) form into an output power signal in a direct current (DC) form; and a controller configured to set the matching impedance value of the matching circuit by transmitting a switching signal for adjusting the connection states of the plurality of switches to the plurality of switches, wherein the plurality of capacitors comprise:

a plurality of parallel capacitors connected to each other in parallel between a ground terminal and an input terminal to which the input power signal is applied; and a series capacitor connected in series between any one of the plurality of parallel capacitors and the ground terminal, wherein the plurality of switches comprise:

a plurality of parallel switches configured to adjust connections of the plurality of parallel capacitors based on the switching signal;

a series switch configured to adjust a connection of the series capacitor based on the switching signal; and an intermediate switch configured to alter, based on the switching signal, a connection between a parallel capacitor connected to the series capacitor among the plurality of parallel capacitors and remaining parallel capacitors, and wherein the controller is further configured to:

set the matching impedance value to a first impedance value, and receive a first output power signal from the power conversion circuit;

set the matching impedance value to a second impedance value that is greater than the first impedance value by a first adjustment value, and receive a second output power signal from the power conversion circuit; and select an optimal matching impedance value based on a result of comparing a voltage value of the first output power signal with a voltage value of the second output power signal, and set the optimal matching impedance value as the matching impedance value.

5. The electronic device of claim 4, wherein the controller is further configured to:

when the voltage value of the first output power signal is greater than or equal to the voltage value of the second output power signal, select the first impedance value as the optimal matching impedance value; and when the voltage value of the first output power signal is less than the voltage value of the second output power signal, set the matching impedance value to a third impedance value that is greater than the second impedance value by the first adjustment value, receive a third output power signal from the power conversion circuit, and select the optimal matching impedance value based on a result of comparing the voltage value of the second output power signal with a voltage value of the third output power signal.

6. The electronic device of claim 5, wherein the controller is further configured to:

set the matching impedance value to a fourth impedance value that is greater than the second impedance value by a second adjustment value, receive a fourth output power signal from the power conversion circuit, and select the optimal matching impedance value based on a result of comparing the voltage value of the second output power signal with a voltage value of the fourth output power signal, wherein the second adjustment value is less than the first adjustment value in response to the voltage value of the second output power signal being greater than or equal to the voltage value of the third output power signal; and set the matching impedance value to a fifth impedance value that is greater than the third impedance value by the first adjustment value, receive a fifth output power signal from the power conversion circuit, and select the optimal matching impedance value based on a result of comparing the voltage value of the third output power signal with a voltage value of the fifth output power signal in response to the voltage value of the second output power signal being less than the voltage value of the third output power signal.

7. The electronic device of claim 6, wherein the controller is further configured to:

select the second impedance value as the optimal matching impedance value in response to the voltage value of the second output power signal being greater than or equal to the voltage value of the fourth output power signal; and select the fourth impedance value as the optimal matching impedance value in response to the voltage value of the second output power signal being less than the voltage value of the fourth output power signal.

8. The electronic device of claim 6, wherein the controller is further configured to:

set the matching impedance value to a sixth impedance value that is greater than the third impedance value by the second adjustment value, receive a sixth output power signal from the power conversion circuit, and select the optimal matching impedance value based on a result of comparing the voltage value of the third output power signal with a voltage value of the sixth output power signal in response to the voltage value of the third output power signal being greater than or equal to the voltage value of the fifth output power signal; and set the matching impedance value to a seventh impedance value that is greater than the fifth impedance value by the first adjustment value, receive a seventh output power signal from the power conversion circuit, and select the optimal matching impedance value based on a result of comparing the voltage value of the fifth output power signal with a voltage value of the seventh output power signal in response to the voltage value of the third output power signal being less than the voltage value of the fifth output power signal.

9. The electronic device of claim 8, wherein the controller is further configured to:

select the third impedance value as the optimal matching impedance value in response to the voltage value of the third output power signal being greater than or equal to the voltage value of the sixth output power signal; and select the sixth impedance value as the optimal matching impedance value in response to the voltage value of the third output power signal being less than the voltage value of the sixth output power signal.

10. The electronic device of claim 8, wherein the controller is further configured to:

set the matching impedance value to an eighth impedance value that is greater than the fifth impedance value by the second adjustment value, receive an eighth output power signal from the power conversion circuit, and select the optimal matching impedance value based on a result of comparing the voltage value of the fifth output power signal with a voltage value of the eighth output power signal in response to the voltage value of the fifth output power signal being greater than or equal to the voltage value of the seventh output power signal; and select the seventh impedance value as the optimal matching impedance value in response to the voltage value of the fifth output power signal being less than the voltage value of the seventh output power signal.

11. The electronic device of claim 10, wherein the controller is further configured to:

select the fifth impedance value as the optimal matching impedance value in response to the voltage value of the fifth output power signal being greater than or equal to the voltage value of the eighth output power signal; and select the eighth impedance value as the optimal matching impedance value in response to the voltage value of the fifth output power signal being less than the voltage value of the eighth output power signal.

12. An operating method of an electronic device comprising a matching circuit, a power conversion circuit, and a controller, the matching circuit comprising a plurality of capacitors and a plurality of switches, having different matching impedance values according to connection states of the plurality of switches, and configured to output a matching power signal by impedance matching an input power signal, the power conversion circuit being configured to convert the matching power signal in an alternating current (AC) form into an output power signal in a direct current (DC) form, and the controller being configured to set the matching impedance value of the matching circuit by transmitting a switching signal that alters the connection states of the plurality of switches to the plurality of switches, the operating method comprising:

receiving the output power signal from the power conversion circuit;

selecting an optimal matching impedance value based on a plurality of output power signals that are received; and setting the optimal matching impedance value as the matching impedance value, wherein the receiving of the output power signal comprises receiving the output power signal from the power conversion circuit while increasing the matching impedance value by a first adjustment value, and wherein the receiving of the output power signal further comprises, setting, as the matching impedance value, an impedance value that is greater than a matching impedance value corresponding to an output power signal having a maximum voltage value among the plurality of output power signals by a second adjustment value, and receiving an additional output power signal from the power conversion circuit in response to a voltage value of the received output power signal being less than a voltage value of a previously received output power signal, wherein the second adjustment value is less than the first adjustment value, and wherein the selecting of the optimal matching impedance value comprises selecting, as the optimal matching impedance value, a matching impedance value corresponding to a greater value of the maximum voltage value of the plurality of output power signals and a voltage value of the additional output power signal.

13. The operating method of claim 12, further comprising, stopping the receiving of the output power signal in response to a voltage value of the received output power signal being less than a voltage value of a previously received output power signal.

14. The operating method of claim 12, wherein the selecting of the optimal matching impedance value comprises selecting, as the optimal matching impedance value, a matching impedance value corresponding to an output power signal having a maximum voltage value among the plurality of output power signals.

* * * * *